(12) United States Patent
Loo et al.

(10) Patent No.: US 10,818,511 B1
(45) Date of Patent: Oct. 27, 2020

(54) PLANE POLISHING METHOD OF SILICON WAFER AND PROCESSING METHOD OF SILICON WAFER

(71) Applicant: AAC ACOUSTIC TECHNOLOGIES (SHENZHEN) CO., LTD., Shenzhen (CN)

(72) Inventors: Lieng Loo, Singapore (SG); Wooicheang Goh, Singapore (SG); Kahkeen Lai, Singapore (SG)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/562,460

(22) Filed: Sep. 6, 2019

(30) Foreign Application Priority Data

May 6, 2019 (CN) .......................... 2019 1 0370674

(51) Int. Cl.
*H01L 21/321* (2006.01)
*H01L 21/463* (2006.01)
*H01L 21/304* (2006.01)

(52) U.S. Cl.
CPC ........ *H01L 21/3212* (2013.01); *H01L 21/304* (2013.01); *H01L 21/463* (2013.01)

(58) Field of Classification Search
CPC ............. H01L 21/3212; H01L 21/3226; H01L 21/3213; H01L 21/32105; H01L 21/463; H01L 21/304

USPC ........ 438/691, 692, 693, 694, 770, 756, 769
See application file for complete search history.

(56) References Cited

U.S. PATENT DOCUMENTS

| | | | | |
|---|---|---|---|---|
| 7,491,621 B2* | 2/2009 | Chen | ................. | H01L 21/76224 257/E21.546 |
| 7,638,398 B2* | 12/2009 | Cho | ........................ | H01L 21/84 257/259 |
| 8,420,541 B2* | 4/2013 | Shih | .................. | H01L 21/02164 257/E21.24 |
| 9,809,451 B2* | 11/2017 | Chan | .................... | B81B 3/0021 |

* cited by examiner

Primary Examiner — Lan Vinh
(74) Attorney, Agent, or Firm — W&G Law Group LLP

(57) ABSTRACT

The disclosure provides a plane polishing method and a processing method of the silicon wafer. The plane polishing method includes steps of: depositing a hard mask on a silicon substrate to form a silicon wafer base material; forming an opening on the hard mask by photolithography or etching; carrying out an oxidation reaction on a portion of the silicon substrate exposed by the opening, forming an oxide layer having a bottom embedded in the silicon substrate and a top protruding and exposed outside the hard mask by oxidizing the silicon substrate; and polishing the oxide layer by chemical mechanical planarization. In the present disclosure, the surface formed by the oxide layer and the hard mask flat is flat, without a recess even in the case of large structures, thereby precisely controlling a shape and a depth of the cavity in accordance with an oxidation rate on a silicon substrate.

12 Claims, 8 Drawing Sheets

US 10,818,511 B1

PLANE POLISHING METHOD OF SILICON WAFER AND PROCESSING METHOD OF SILICON WAFER

TECHNICAL FIELD

The present disclosure relates to the field of silicon wafer processing, and particularly, to a plane polishing method of a silicon wafer and a processing method of a silicon wafer.

BACKGROUND

Chemical mechanical planarization (CMP), as a polishing process, uses a chemical slurry formulation and a mechanical polishing process to remove unwanted conductive or dielectric materials from silicon wafers, thereby achieving a nearly perfect flat and smooth surface (so-called planarization treatment). A polishing method of a silicon wafer in the related art is: 1. forming an opening on a hard mask by photolithography and etching; 2. etching a portion of a silicon substrate exposed by the opening by a wet method or a dry method to form a concave cavity; 3. depositing an oxide layer to fill the concave cavity; 4. treating the deposited oxide layer by chemical mechanical planarization. However, a recess may be formed during the process of filling the cavity by depositing the oxide layer. Thus, after the deposited oxide layer is treated by the chemical mechanical planarization, a defect of recess may also occur on the deposited oxide layer. The defect of recess is a major challenge of planarization using CMP, in particular, for a large-opening cavity structures in MEMS devices.

Therefore, it is urgent to provide a plane polishing method of planarization, which can avoid an occurrence of recess.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

REFERENCE SIGNS

100, silicon wafer; 10, silicon wafer base material; 1, silicon substrate; 101, cavity; 2, hard mask; 20, opening; 21, $SiO_2$ layer; 221, first $Si_3N_4$ layer; 222, second $Si_3N_4$ layer; 3, oxide layer; 4, structural layer; 40, opening hole.

DESCRIPTION OF EMBODIMENTS

The present disclosure will be further illustrated with reference to the accompanying drawings and the embodiments.

Embodiment 1

Figure 1:
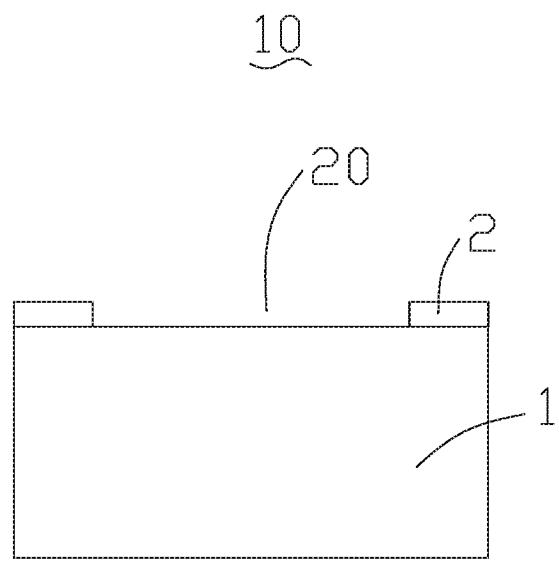
FIG. 1 is a structural schematic diagram of a silicon wafer base material in a plane polishing method of a silicon wafer according to an embodiment of the present disclosure.
Figure 2:
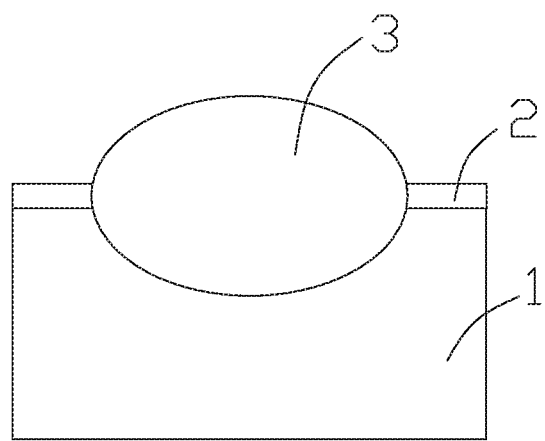
FIG. 2 is a structural schematic diagram of a silicon wafer after an oxidation reaction in a plane polishing method of a silicon wafer according to an embodiment of the present disclosure.
Figure 3:
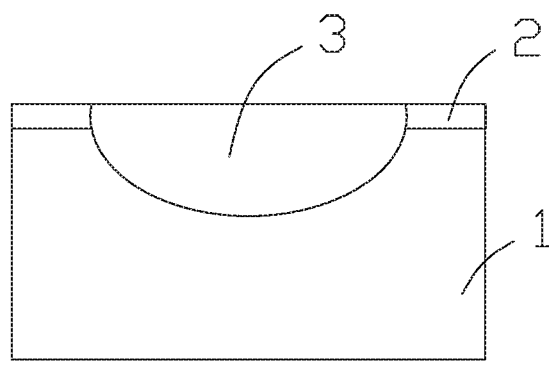
FIG. 3 is a structural schematic diagram of a silicon wafer in a plane polishing method of a silicon wafer according to an embodiment of the present disclosure after chemical mechanical planarization.

Referring to FIG. 1 to FIG. 3, the present embodiment provides a plane polishing method of a silicon wafer, and the method includes the following steps:

depositing a hard mask 2 on a silicon substrate 1 to form a silicon wafer base material 10;

forming an opening on the hard mask 2 by photolithography or etching;

carrying out an oxidation reaction on a portion of the silicon substrate 1 exposed by the opening 20, forming, by oxidizing the silicon substrate 1, an oxide layer 3 having a bottom embedded in the silicon substrate 1 and a top protruding and exposed outside the hard mask 2; and polishing the oxide layer 3 by chemical mechanical planarization.

In an embodiment, a portion of the oxide layer 3 protruding outside the hard mask 2 is removed by the chemical mechanical planarization in such a manner that a surface formed by the hard mask 2 and the oxide layer 3 is a horizontal surface.

In an embodiment, the hard mask 2 is a first $Si_3N_4$ layer 221 deposited on the silicon substrate 1.

In an embodiment, the oxidation reaction is carried out at a temperature of 700° C. to 1300° C.

In an embodiment, the opening 20 extends to the silicon substrate 1.

Figure 4A:
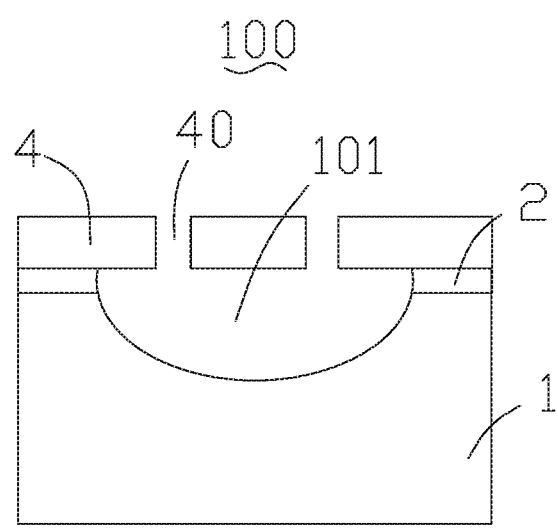
FIG. 4a schematically illustrates a structure formed with a cavity after an oxide layer is processed by a processing method of a silicon wafer according to an embodiment of the present disclosure.

The present embodiment further provides a processing method of a silicon wafer, and the processing method includes the following steps:

A silicon wafer base material 10 is prepared by stacking a silicon substrate 1 and a hard mask 2, and specifically a first $Si_3N_4$ layer 221 is formed on the silicon substrate 1;

The silicon wafer base material 10 is polished by using the plane polishing method of a silicon wafer as described above, to make a surface formed by the hard mask 2 and the oxide layer 3 be a horizontal surface. As shown in FIG. 4a, a structural layer 4 is deposited on the horizontal surface formed by the hard mask 2 and the oxide layer 3, and an opening hole 40 is formed in the structural layer. Further, the oxide layer 3 is removed through the opening hole 40 to form a cavity 101 in the silicon substrate 1. It can be understood that the structural layer 4 can be a diaphragm.

Figure 4B:
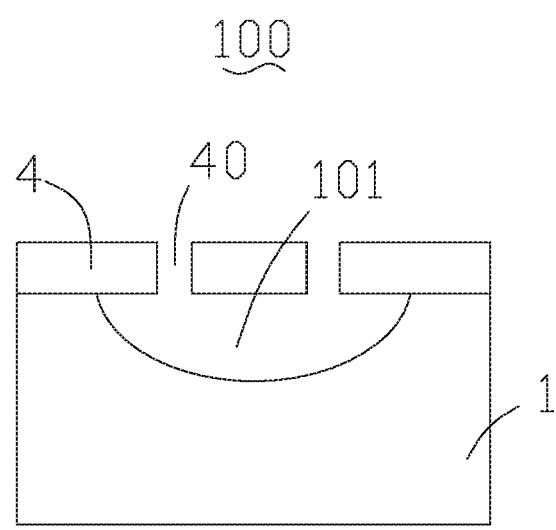
FIG. 4b schematically illustrates another structure formed with a cavity after an oxide layer is processed by a processing method of a silicon wafer according to an embodiment of the present disclosure.

An embodiment shown in FIG. 4b is also possible. After the hard mask 2 and the oxide layer 3 form the horizontal surface, the hard mask 2 is etched and removed to expose the silicon substrate 1. Then, the chemical mechanical planarization is performed on the oxide layer 3 again to form a new horizontal surface by flush surfaces of the oxide layer 3 and the silicon substrate 1. The structural layer 4 is deposited on the new horizontal surface, and an opening hole 40 is formed in the structural layer 4. Then, the oxide layer 3 is removed through the opening hole 40 to form a cavity 101 in the silicon substrate 1.

In this embodiment, since the oxide layer 3 protruding and exposed outside the hard mask 2 has an elliptical shape and has no recess, the surface formed by the oxide layer 3 and the hard mask 2 also has no recess after the portion of the oxide layer 3 protruding from the hard mask 2 is removed by the chemical mechanical planarization. Moreover, instead of etching the silicon substrate 1 to form the cavity first, the oxidation reaction directly occurs on the silicon substrate 1, thereby simplifying the planarization method for forming the cavity 101. In addition, since a rate of the oxidation reaction is controllable, a shape and a depth of the cavity can be precisely controlled based on the rate of the oxidation reaction on a particular silicon substrate 1.

Embodiment 2

Figure 5:
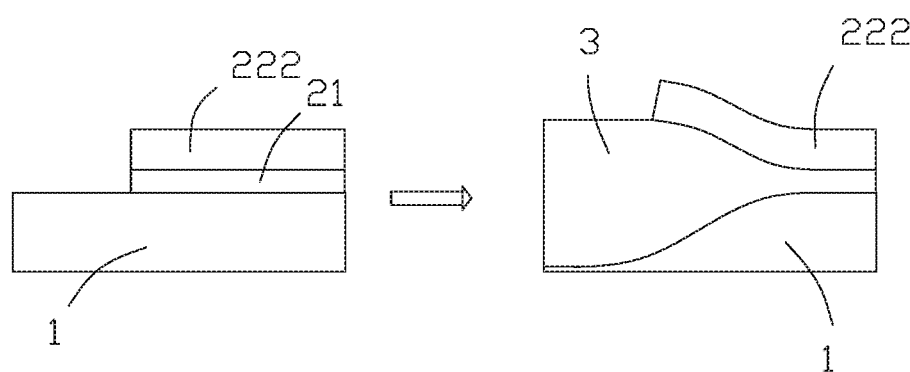
FIG. 5 schematically illustrates a structural change of a silicon wafer according to an embodiment, after an oxidation reaction in a plane polishing method of a silicon wafer according to an embodiment of the present disclosure.

Referring to FIG. 1 to FIG. 3 and FIG. 5, Embodiment 2 differs from Embodiment 1 in the preparation of the hard mask 2. In Embodiment 2, the hard mask 2 is a $SiO_2$ layer 21 deposited on the silicon substrate 1 and a second $Si_3N_4$ layer 222 deposited on the $SiO_2$ layer. For example, the second $Si_3N_4$ layer 222 has a greater thickness than the $SiO_2$ layer 21. FIG. 5 illustrate a structural change of the silicon wafer 100 after the oxidation reaction, in which a profile of the formed oxide layer 3 is different from that of Embodiment 1.

Embodiment 3

Figure 6:
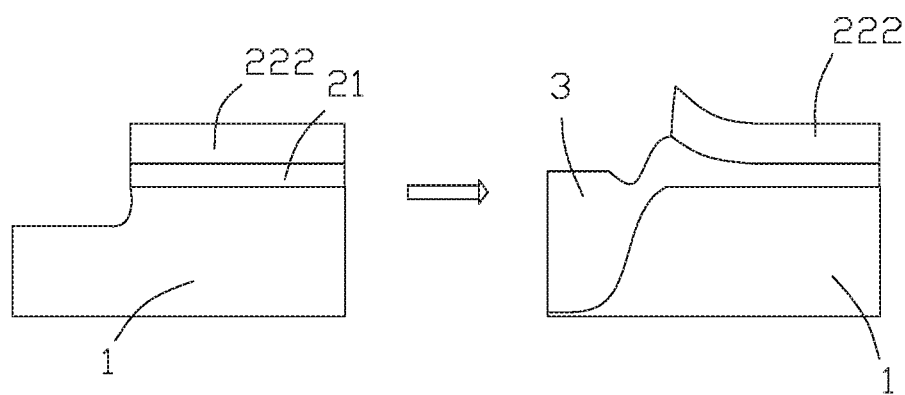
FIG. 6 schematically illustrates a structural change of a silicon wafer according to another embodiment, after an oxidation reaction in a plane polishing method of a silicon wafer according to an embodiment of the present disclosure.

Embodiment 3 differs from Embodiment 1 and Embodiment 2 in the preparation of the opening 20. Referring to FIG. 1 to FIG. 3 and FIG. 6, in Embodiment 3, an opening is formed in the hard mask 2 or in the hard mask 2 and the silicon substrate 1. FIG. 6 illustrate a structural change of the silicon wafer 100 after the oxidation reaction, in which a profile of the formed oxide layer 3 is different from that of Embodiment 1.

Embodiment 4

Figure 7:
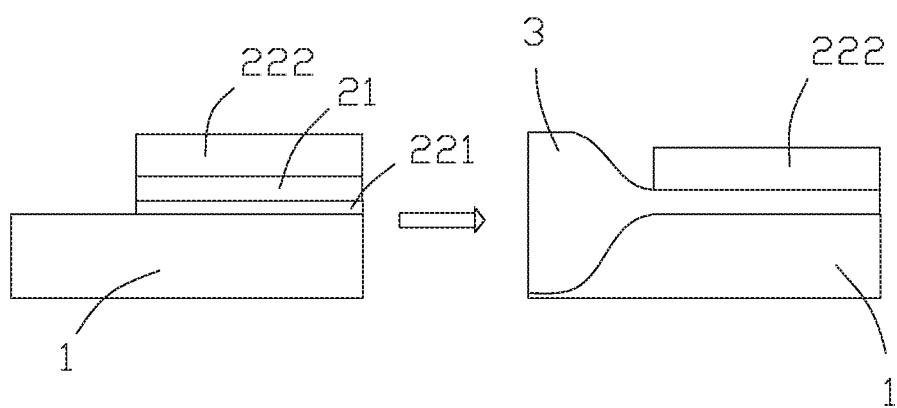
FIG. 7 schematically illustrates a structural change of a silicon wafer according to still another embodiment, after an oxidation reaction in a plane polishing method of a silicon wafer according to an embodiment of the present disclosure.

Referring to FIG. 1 to FIG. 3 and FIG. 7, Embodiment 4 differs from Embodiment 1, Embodiment 2, and Embodiment 3 in the preparation of the hard mask 2. In Embodiment 4, the hard mask is a first $Si_3N_4$ layer 221 deposited on the silicon substrate, a $SiO_2$ layer 21 deposited on the first $Si_3N_4$ layer 221, and a second $Si_3N_4$ layer 222 deposited on the $SiO_2$ layer 21. The first $Si_3N_4$ layer 221, the $SiO_2$ layer 21, and the second $Si_3N_4$ layer 222 are laminated to form the hard mask 2. FIG. 7 illustrate a structural change of the silicon wafer 100 after the oxidation reaction. In the formed silicon wafer 100, a profile of the formed oxide layer 3 is different from that of Embodiment 1.

For example, the second $Si_3N_4$ layer 222 has a greater thickness than the $SiO_2$ layer 21 and the first $Si_3N_4$ layer 221.

For example, the $SiO_2$ layer 21 has a greater thickness than the first $Si_3N_4$ layer 221.

A shape of the oxide layer 3 formed after the oxidation reaction varies with a change of composition of the hard mask 2. The $SiO_2$ layer 21 and the oxide layer 3 are formed into one piece.

In summary, the present disclosure adopts an oxidation method to change a conventional method for forming a cavity in a silicon substrate. Since the oxide layer 3 protruding and exposed outside the hard mask 2 has an elliptical shape and has no recess, the surface formed by the oxide layer 3 and the hard mask 2 also has no recess after a portion of the oxide layer 3 protruding from the hard mask 2 is removed by the chemical mechanical planarization. Moreover, instead of etching the silicon substrate 1 to form the cavity first, the oxidation reaction directly occurs on the silicon substrate 1, thereby simplifying the planarization method for forming the cavity 101. In addition, since the rate of the oxidation reaction is controllable, the shape and the depth of the cavity 101 can be precisely controlled based on the rate of the oxidation reaction on the silicon substrate 1. The shape and the depth of the cavity can be controlled by the oxidation process and the type of silicon substrate (e.g., different Si crystal orientations, different dopant types, or different dopant concentrations). The rate of the oxidation reaction may be affected by adding a derivative of a dopant, for example, through injection. Furthermore, a design of the hard mask 2 (single layered, double layered or multi-$Si_3N_4$ layered) can be further used to control a turning of an oxidation profile. The turning of the oxidation profile defines the desired profile of the cavity 101, which is conducive to an elimination of the recess. In short, the present disclosure provides a process for etching a cavity, which is more stable and consistent than a wet method or a dry method and is further optimized with respect to the shape or depth and required time.

The above is only the embodiments of the present disclosure, and it should be noted that those skilled in the art can make improvements without departing from the inventive concept of the present disclosure, but these are all fall into the protection scope of the present disclosure.

What is claimed is:

1. A processing method of a silicon wafer, comprising steps of:

preparing a silicon wafer base material formed by depositing a hard mask on a silicon substrate; and forming an opening on the hard mask by photolithography or etching;

carrying out an oxidation reaction on a portion of the silicon substrate exposed by the opening, forming, by oxidizing the silicon substrate, an oxide layer having a bottom embedded in the silicon substrate and a top protruding and exposed outside the hard mask; and polishing the oxide layer by chemical mechanical planarization to make a surface formed by the hard mask and the oxide layer be a horizontal surface, depositing a structural layer on the horizontal surface, forming an opening hole in the structural layer, and removing the oxide layer through the opening hole to form a cavity in the silicon substrate to suspend the structure layer on the cavity; the structure layer suspends on the cavity.

2. The processing method of a silicon wafer as describe in claim 1, wherein the opening extends to the silicon substrate.

3. The processing method of a silicon wafer as describe in claim 1, wherein the structural layer is a diaphragm.

4. A processing method of a silicon wafer, comprising steps of:

preparing a silicon wafer base material formed by depositing a hard mask on a silicon substrate; and forming an opening on the hard mask by photolithography or etching;

carrying out an oxidation reaction on a portion of the silicon substrate exposed by the opening, forming, by oxidizing the silicon substrate, an oxide layer having a bottom embedded in the silicon substrate and a top protruding and exposed outside the hard mask; and polishing the oxide layer by chemical mechanical planarization so that a surface formed by the hard mask and the oxide layer is a horizontal surface, removing the hard mask by etching to expose the silicon substrate, polishing the oxide layer again by the chemical mechanical planarization to form a new horizontal surface by flush surfaces of the oxide layer and the silicon substrate, depositing a structural layer on the new horizontal surface, forming an opening hole in the structural layer, and removing the oxide layer through the opening hole to form a cavity in the silicon substrate; the structure layer suspends on the cavity.

5. The processing method of a silicon wafer as describe in claim 1, wherein a portion of the oxide layer protruding outside the hard mask is removed by the chemical mechanical planarization in such a manner that a surface formed by the hard mask and the oxide layer is a horizontal surface.

6. The processing method of a silicon wafer as describe in claim 1, wherein the hard mask is a first Si3N4 layer deposited on the silicon substrate.

7. The processing method of a silicon wafer as describe in claim 1, wherein the oxidation reaction is carried out at a temperature of 700° C. to 1300° C.

8. The processing method of a silicon wafer as describe in claim 4, wherein the structural layer is a diaphragm.

9. The processing method of a silicon wafer as describe in claim 1, wherein the hard mask is a SiO2 layer deposited on the silicon substrate and a second Si3N4 layer deposited on the SiO2 layer.

10. The processing method of a silicon wafer as describe in claim 9, wherein the second Si3N4 layer has a thickness greater than the SiO2 layer.

11. The processing method of a silicon wafer as describe in claim 9, wherein the hard mask is a first Si3N4 layer deposited on the silicon substrate, a SiO2 layer deposited on the first Si3N4 layer, and a second Si3N4 layer deposited on the SiO2 layer.

12. The processing method of a silicon wafer as describe in claim 11, wherein the second Si3N4 layer has a thickness greater than the SiO2 layer and the first Si3N4 layer.

* * * * *